United States Patent
Cho et al.

(10) Patent No.: US 7,102,872 B2
(45) Date of Patent: Sep. 5, 2006

(54) ELECTROSTATIC CHUCK

(75) Inventors: Jae-yong Cho, Daegu (KR); Byeong-sun An, Suwon (KR); Jin-man Kim, Yongin (KR); Kyung-sun Kim, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 259 days.

(21) Appl. No.: 10/823,550

(22) Filed: Apr. 14, 2004

(65) Prior Publication Data

US 2005/0018377 A1 Jan. 27, 2005

(30) Foreign Application Priority Data

Jul. 24, 2003 (KR) .................... 10-2003-0050909

(51) Int. Cl.
*H01H 1/00* (2006.01)

(52) U.S. Cl. .................. 361/234; 361/233; 156/915; 156/345.51; 156/345.43; 118/500; 118/715; 118/730

(58) Field of Classification Search ............ 361/234, 361/233; 156/915
See application file for complete search history.

(56) References Cited

U.S. PATENT DOCUMENTS 5,612,851 A * 3/1997 Barnes et al. ............. 361/234
6,733,624 B1 * 5/2004 Koshiishi et al. .......... 118/500
2003/0106647 A1 * 6/2003 Koshiishi et al. ....... 156/345.53

FOREIGN PATENT DOCUMENTS

| JP | 2000-36490 | 2/2000 |
|---|---|---|
| JP | 2002-223366 | 8/2002 |
| KR | 2001-46528 | 6/2001 |
| KR | 10-303076 | 7/2001 |
| KR | 10-313028 | 10/2001 |

* cited by examiner

*Primary Examiner*—Brian Sircus
*Assistant Examiner*—Terrence Willoughby
(74) *Attorney, Agent, or Firm*—Staas & Halsey LLP

(57) ABSTRACT

An ESC (Electrostatic Chuck) to chuck an object by electrostatic force, having an ESC main body supporting the object; a guide ring supported by the ESC main body and encircling the object; a dielectric material layer interposed between the guide ring and the ESC main body; a media gas supplier to supply a media gas to the guide ring; and a power supplier to supply power to the ESC main body. With this configuration, the ESC provides an apparatus to chuck a guide ring to an ESC main body, while maintaining the guide ring and an object, such as a wafer, at the same or similar temperature, thereby enhancing uniformity of the object during a semiconductor manufacturing process such as etching, deposition, or the like.

21 Claims, 6 Drawing Sheets

ELECTROSTATIC CHUCK

CROSS-REFERENCE TO RELATED APPLICATIONS

This application claims the benefit of Korean Patent Application No. 2003-50909, filed Jul. 24, 2003 in the Korean Intellectual Property Office, the disclosure of which is incorporated herein by reference.

BACKGROUND OF THE INVENTION

1. Field of the Invention

The present invention relates to an electrostatic chuck (hereinafter, "ESC"), and more particularly, to an ESC with an improved combining structure, having a guide ring and an ESC main body to enhance uniformity of deposition and/or etching in a semiconductor manufacturing process.

2. Description of the Related Art

Semiconductor elements are produced by applying various processes to materials. Examples of such processes include a deposition process, an etching process, and a cleaning process. Each process is performed in a chamber that needs to maintain a controlled work environment.

These chambers are often equipped with chucks to hold objects such as wafers. The chucks can be mechanical, vacuum, or electrostatic.

Mechanical chucks stabilize wafers on a supporting surface by using mechanical holders. Mechanical chucks have a disadvantage in that they often cause distortion of wafers due to non-uniform forces being applied to the wafers. Thus, wafers are often chipped or otherwise damaged, resulting in a lower yield.

Vacuum chucks operate by lowering the pressure between the wafer and the chuck below that of the chamber, thereby holding the wafer. Although the force applied by vacuum chucks is more uniform than that applied by mechanical chucks, pressures in the chamber during semiconductor manufacturing processes are non-uniform. Because of the variable chamber pressure, proper force applied cannot be in some situations. In other situations, the pressure in the chamber is too low to perform a vacuum chucking operation.

ESCs, which are gaining popularity, stabilize and hold wafers utilizing a voltage difference between the wafers and electrodes. ESCs apply a more uniform force than mechanical chucks or vacuum chucks.

In an ESC, the chucking of a wafer is achieved using the Coulomb force and the Johnsen-Rahbek effect generated when a voltage-applied dielectric material is charged and its electrodes are polarized. The Johnsen-Rahbek effect is a force generated when a gap is formed by surface irregularities between a wafer and a dielectric material. The gap can be likened to a vacuum for dielectric material. The gap is charged and polarized by current generated when voltage is applied thereto. The ESC can perform heat processing uniformly and minimize generation of particles by attaching the wafer to an ESC main body. Recently, ESCs have been used to hold wafers in a process chamber for chemical and/or physical deposition apparatuses, as well as etching apparatuses.

FIG. 1 is a sectional view of a reaction device having a conventional ESC.

As shown in FIG. 1, the reaction device has an ESC in a sealed reaction chamber 5. The ESC is supported by a supporter 7. The reaction chamber 5 provides a sealed space to form an atmosphere for an object 101 to be processed. Outside of the reaction device, a reaction gas source 3 is provided to supply the reaction gas. The reaction gas source 3 supplies the reaction gas for deposition or etching to be performed during the semiconductor manufacturing processing.

A media gas supplier 50 supplies a media gas to mediate heat transmission and cool down the ESC main body 130.

The ESC comprises an ESC main body 130; an object 101 disposed on the ESC main body 130; a guide ring 110 to guide the object 101; a voltage supplier 75 to supply voltage to the ESC main body 130; and an RF generator 70 to supply RF power.

FIG. 2 and FIG. 3 are sectional views of the ESC main body of a conventional ESC, and the ESC main body of a conventional ESC with an additional dielectric material layer added.

The ESC main body 130 is made of a metal such as aluminum. The ESC main body 130 has a voltage supplied to it by the voltage supplier 75. When voltage is supplied, the ESC acts as an electrode.

A dielectric material layer 120 in the ESC main body 130 generates an electric charge between the dielectric material layer 120 and the ESC main body 130 when voltage is supplied from the voltage supplier 75. Thus the object 101 is chucked on the upper side of the dielectric material layer 120. The thinner the dielectric material layer 120 is, the greater the electric charge. The electric charge is directly proportional to the square root of a value divided by the thickness of the dielectric material layer 120. The dielectric material layer 120 may be made of materials that include: $Al_2O_3$, $SiO_2$, AlN, and the like.

As shown in FIG. 3, the conventional ESC main body with a dielectric material layer 120 has an electrode 135 on top of a first dielectric material layer 120a and a second dielectric material layer 120b on top of the electrode 135. The voltage supplier 75 applies voltage to the electrode 135 so that the object 101 is chucked on the second dielectric material layer 120b.

The object 101 is disposed on the dielectric material layer 120b. In the semiconductor manufacturing processing, the object 101 is a reaction object of the reaction gas and is usually a plate-type wafer. A pattern or a PR (photoresist) is formed in the object 101.

The RF (Radio Frequency) generator 70 supplies the RF power to the ESC main body 130 to form a desirable reaction gas, and the reaction gas formed therein collides with the object 101 of the ESC main body 130.

The temperature of the object 101 is elevated when the reaction gas collides with the object 101. If the temperature of object 101 is elevated during the semiconductor manufacturing processing, the pattern or the PR formed therein can be damaged, and thus the semiconductor element cannot be produced. Therefore, the heated object 101 has to be cooled.

To lower the temperature of the object 101 that was elevated during the semiconductor manufacturing process, the media gas supplier 50 supplies a media gas 55 to transfer heat from the object 101 to the ESC main body 130. Inside of the ESC main body 130, a media gas hole 160 is provided to transmit the media gas 55 to the bottom side of the object 101.

The amount of the media gas 55 injected can be controlled by a gas valve 45 in the media gas hole 160.

The media gas 55 transfers heat from the object 101 to the ESC main body 130. Helium gas or argon gas is used as the media gas 55 for efficiency of heat transfer.

The ESC main body 130 receives the heat transferred by the media gas 55 and the temperature of the ESC main body 130 is increased. The ESC main body 130 utilizes a coolant fluid therein for cooling. The coolant fluid circulates in the ESC main body 130 through coolant passages 180 provided therein. After absorbing the heat from the ESC main body 130, the coolant fluid returns to a coolant supplier (not shown). The circulation of the coolant fluid cools the ESC main body 130.

The guide ring 110 is provided on the ESC main body 130, or in a groove formed thereon. The guide ring 110 encircles the object 101 and guides it. When the guide ring 110 is exposed to the reaction gas with the object 101, the temperature of guide ring 110 is increased during the semiconductor manufacturing process.

The object 101, heated during the semiconductor manufacturing process can be cooled by allowing media gas 55 to contact the bottom side of the heated object 101 through the media gas hole 160 in the ESC main body 130, thereby transferring heat from the object 101 to the ESC main body 130.

In FIGS. 2 and 3, the media gas 55 contacts the bottom of the heated objected 101 and cools the object 101 only by transferring the heat absorbed from the object 101 to the ESC main body 130.

While the media gas 55 cools the heated object 101, the guide ring 110 is not cooled. As a result, a temperature difference develops between the heated object 101 and the guide ring 110. As the temperature difference becomes greater, the heat from the guide ring 110 is transferred to the outer edge of the object 101, thereby causing the object to have a non-uniform temperature in that the edge will heat up, while the center remains cooler. Such a temperature difference can cause the edge and the center of the object 101 to be processed unevenly during a semiconductor manufacturing process such as etching or deposition, thereby reducing the yield of the object 101.

SUMMARY OF THE INVENTION

Accordingly, it is an aspect of the present invention to provide an apparatus to chuck a guide ring to an ESC main body, while maintaining the guide ring and an object, such as a wafer, at the same or similar temperature, thereby enhancing the uniformity and/or yield of the object during a semiconductor manufacturing process such as etching, deposition, or the like.

The foregoing and/or other aspects of the present invention are achieved by providing an ESC to chuck a planar object by electrostatic force. The ESC comprises an ESC main body supporting the object; a guide ring supported by the ESC main body and encircling the object; a dielectric material layer interposed between the guide ring and the ESC main body; a media gas supplier to supply a media gas to the guide ring; and a power supplier to supply power to the ESC main body.

According to an aspect of the present invention, the ESC main body is made using conductive materials, and the power supplied to the ESC main body is transmitted to the dielectric material layer and the guide ring.

According to an aspect of the present invention, the ESC further comprises an electrode interposed between the dielectric material layer and the ESC main body, and supplying the power to the electrode.

According to another aspect of the present invention, a dielectric material layer is interposed between the electrode and the ESC main body.

According to an aspect of the present invention, the ESC further comprises a plurality of media gas supply holes provided in the ESC main body such that the media gas supplied from the media gas supplier can flow therethrough. This allows the media gas to contact the guide ring.

Additional aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompany drawings of which.

DETAILED DESCRIPTION OF THE EMBODIMENTS

Figure 1:
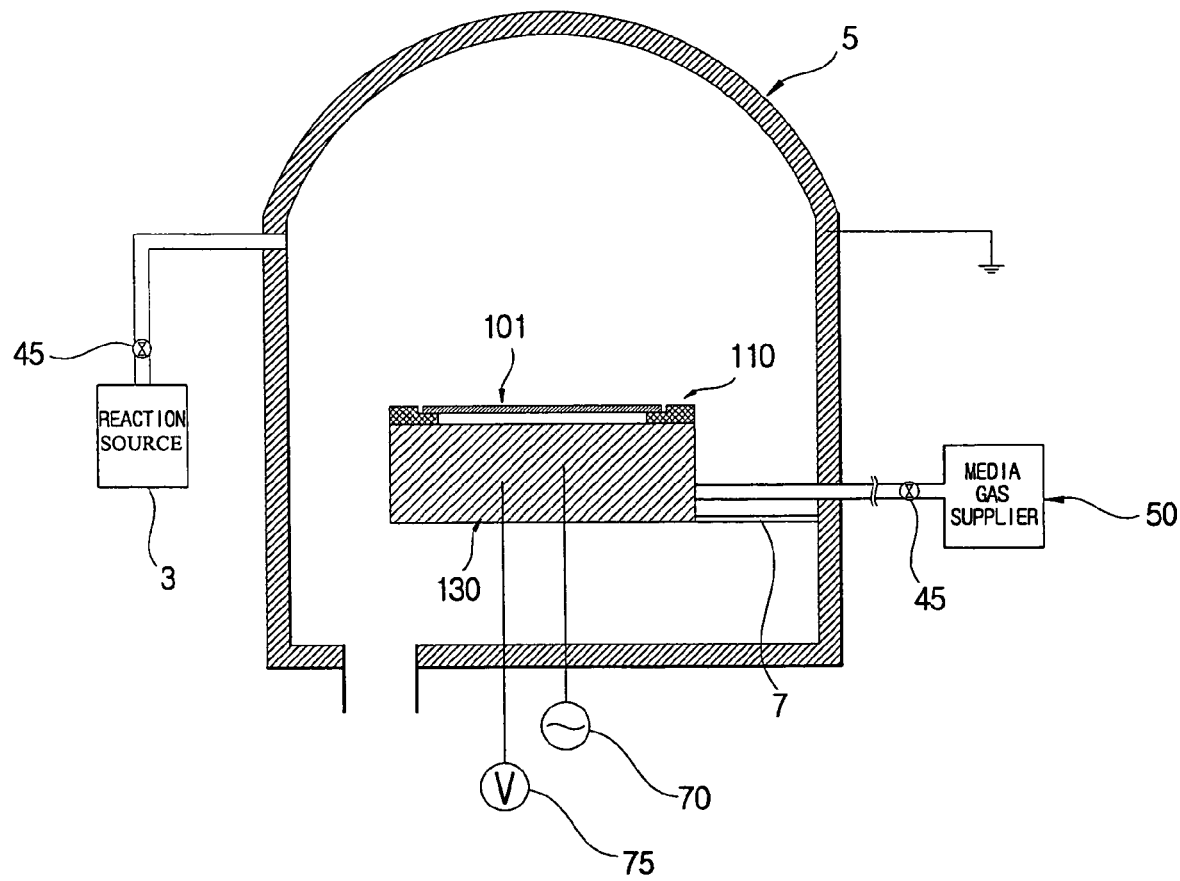
FIG. 1 is a sectional view of a reaction apparatus having a conventional ESC.
Figure 2:
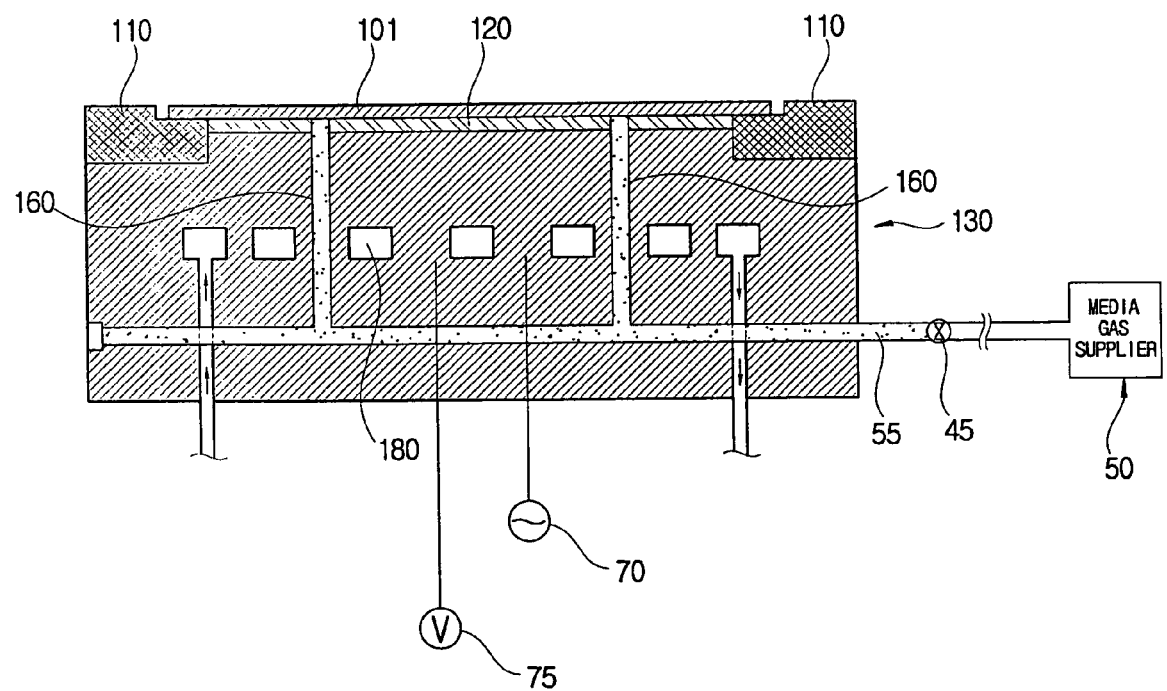
FIG. 2 is a sectional view of a main body of the conventional ESC of FIG. 1.
Figure 3:
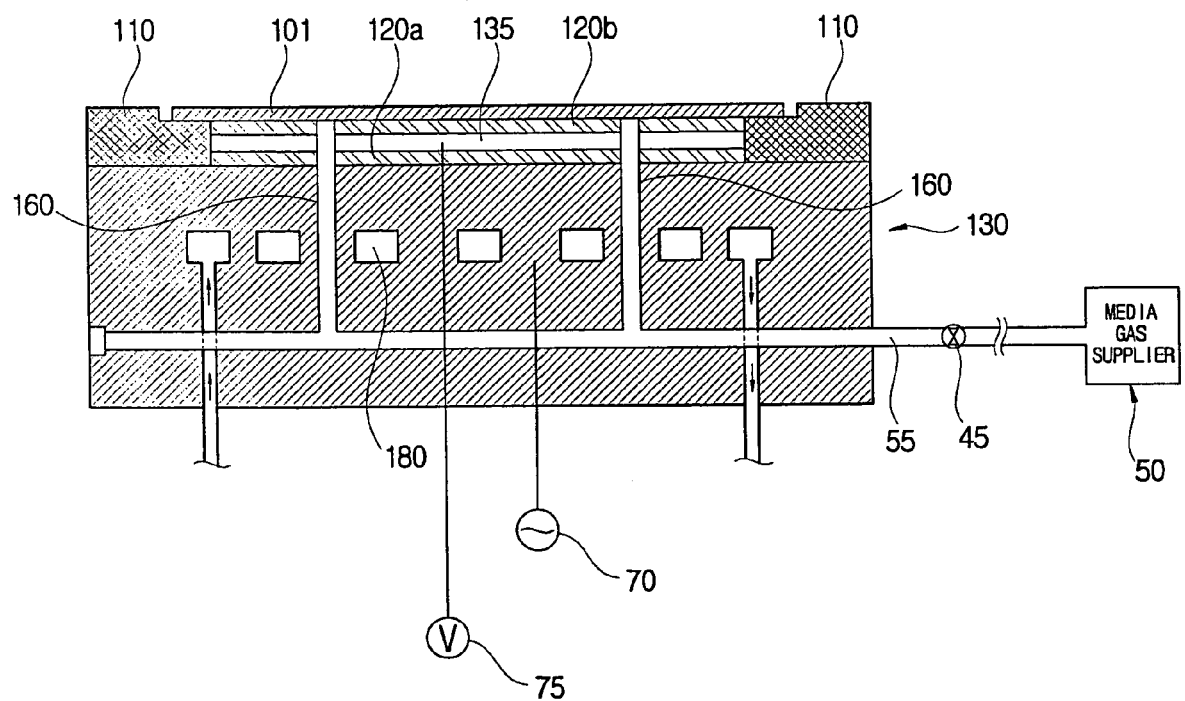
FIG. 3 is a sectional view of a conventional ESC main body having an additional dielectric material layer.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 4:
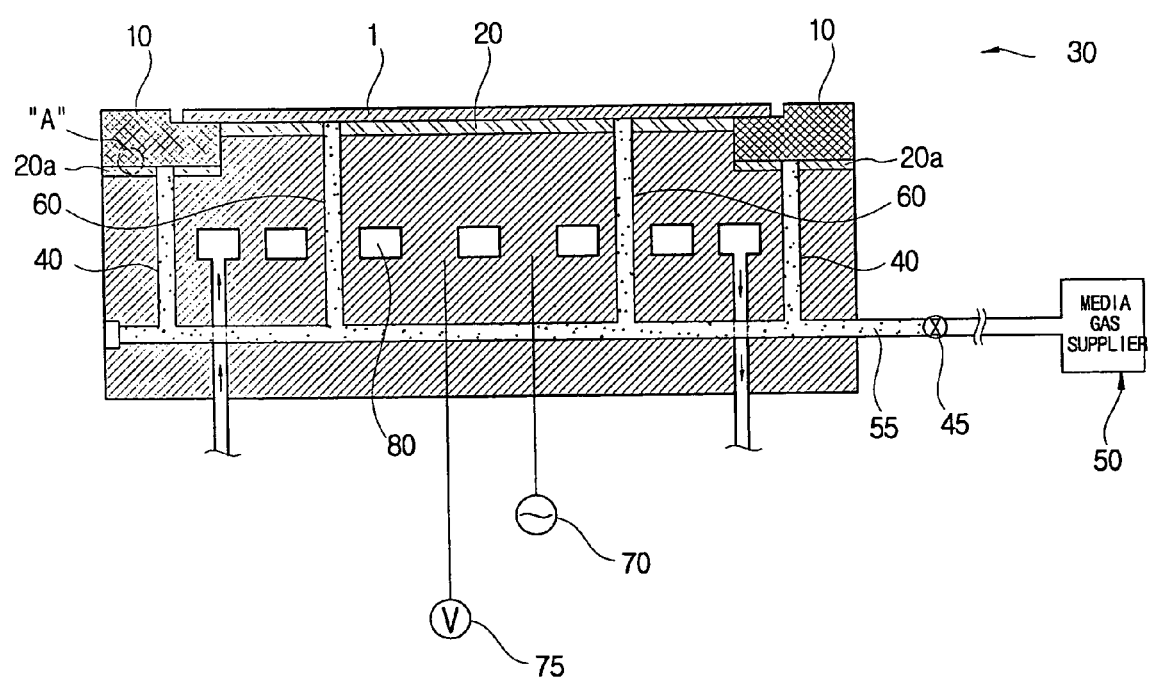
FIG. 4 is a sectional view of a main body of an ESC according to an aspect of the present invention.
Figure 5:
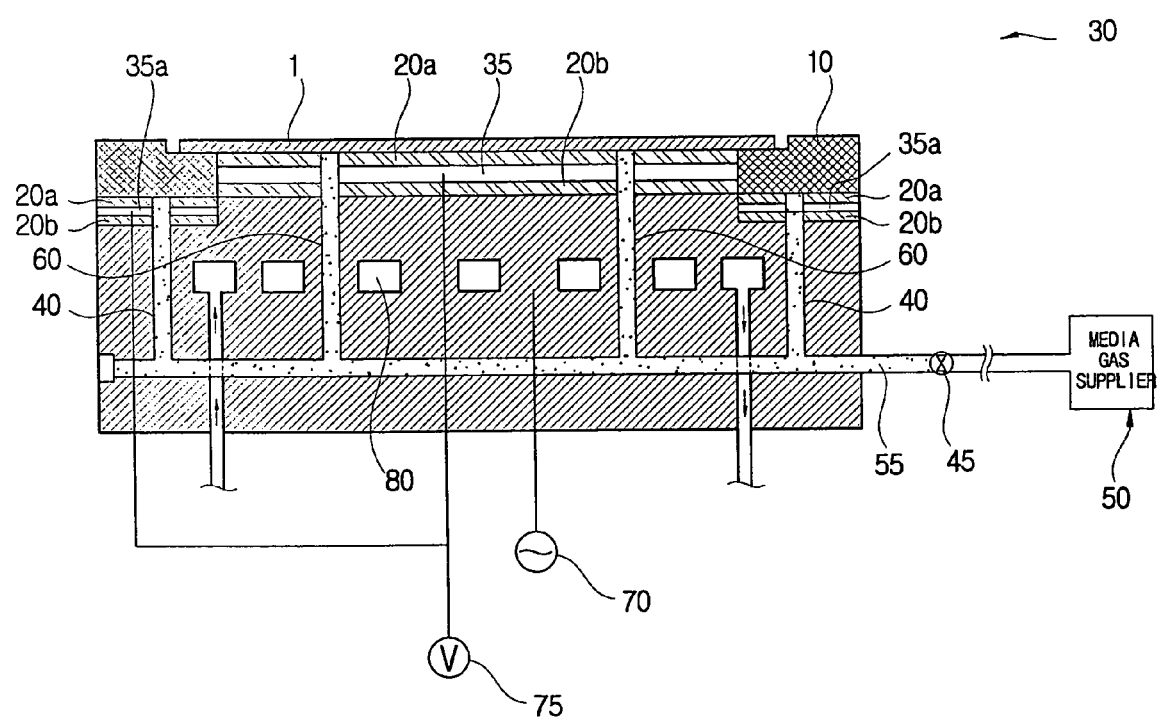
FIG. 5 is a sectional view of an ESC main body having an additional dielectric material layer.

FIG. 4 and FIG. 5 are sectional views of an ESC main body and of an ESC main body having an extra dielectric material layer therein according to an aspect of the present invention.

As shown therein, an ESC apparatus comprises an ESC main body 30 forming an ESC according to an aspect of the present invention; an RF generator 70 to supply power to the ESC main body 30 to form a desirable reaction gas; an object 1 supported by the ESC main body 30; a guide ring 10 encircling the object 1; a dielectric material layer 20 disposed on the ESC main body 30 to generate an electric charge to chuck the guide ring 10 to the ESC main body 30; a voltage supplier 75 to supply power to generate an electric charge in the dielectric material layer 20; a coolant supplier (not shown) to cool the ESC main body 30; a media gas 55 to transfer heat from the object 1 and the guide ring 10 to the ESC main body 30; and a media gas supplier 50 to supply the media gas 55.

According to an aspect of the present invention, the ESC main body 30 comprises a coolant fluid to cool the ESC main body 30; a coolant passage 80 in which the coolant fluid flows; a guide ring media gas supply hole 40 formed through the ESC main body 30 and the dielectric material layer 20; and an object media gas supply hole 60 formed through the ESC main body 30 and the dielectric material layer 20.

In FIGS. 4 and 5, the object 10 is of a plate type (generally a wafer) and disposed on the ESC main body 30.

The ESC main body 30 is generally made using a conductive material. The ESC main body 30 receives RF power from the RF generator 70 and transmits the energy to a reaction gas for a semiconductor manufacturing process.

The guide ring 10 is provided on the ESC main body 30, and encircles and guides the object 1.

The dielectric material layer 20 generates an electric charge to chuck the guide ring 10 to the ESC main body 30. The dielectric material layer 20 is interposed by being layered or bonded on the ESC main body 20. The dielectric material layer 20 is constructed using highly dielectric materials such as oxide, nitride, ceramic, and the like. To increase dielectricity, surface-processed materials are also available for the dielectric material layer 20.

The reaction gas strongly collides with the object 1 and the guide ring 10 during the semiconductor manufacturing process. These collisions cause the temperature of the object 1 and the guide ring 10 to increase.

The media gas supplier 50 supplies the media gas 55 to bottom of the object 1 and the guide ring 10 through the media gas supply holes 40 and 60.

The media gas 55 transmits heat from the object 1 and the guide ring 10 to the ESC main body 30. Helium or argon may be used for the media gas. As a highly heat conductive gas, a helium gas transmits the heat of the object 1 and the guide ring 10 to the ESC main body 30. The media gas 55 flows through the media gas supply holes 40 and 60 of the ESC main body 30. The media gas does not need to be helium or argon, they are mentioned due to their excellent heat transfer capabilities. Other gasses can be used.

The ESC main body 30 is cooled by coolant fluid provided therein. The coolant passage 80 is provided in the ESC main body 30 and the coolant supplier (not shown) supplies the coolant fluid to the coolant passage 80. To cool the ESC main body 30 the coolant fluid circulates through the coolant passage 80.

The media gas supply holes 40 and 60 are provided in the ESC main body 30 to supply an injected media gas to the bottom side of the object 1 and the guide ring 10. The media gas supply holes penetrate the ESC main body 30 and the dielectric material layer 20.

As shown in FIG. 5, an ESC having an electrode 35a according to another aspect of the present invention and a second dielectric material layer 20b may have media gas supply holes 40 and 60 that penetrate the electrode 35a, the first dielectric material layer 20a, and the second dielectric material layer 20b.

As shown in FIG. 5, the media gas supply holes 60 and 40 are provided to supply the media gas 55 to the object 1 and the guide ring 10 respectively. The media gas supply holes 60 and 40 can be connected to each other and supplied by the same media gas 55.

In an alternate aspect of the present invention, the media gas supply holes 60 and 40 can be independent of one another, thereby transferring heat to the ESC main body 30 using different types of media gas 55.

The amount of the media gas 55 supplied to the object 1 and the guide ring 10 can be controlled by the gas valve 45 in the media gas supply holes 40 and 60. As shown in FIG. 5 the media gas 55 can be exhausted by pumping the media gas supply holes 40 and 60.

Figure 6:
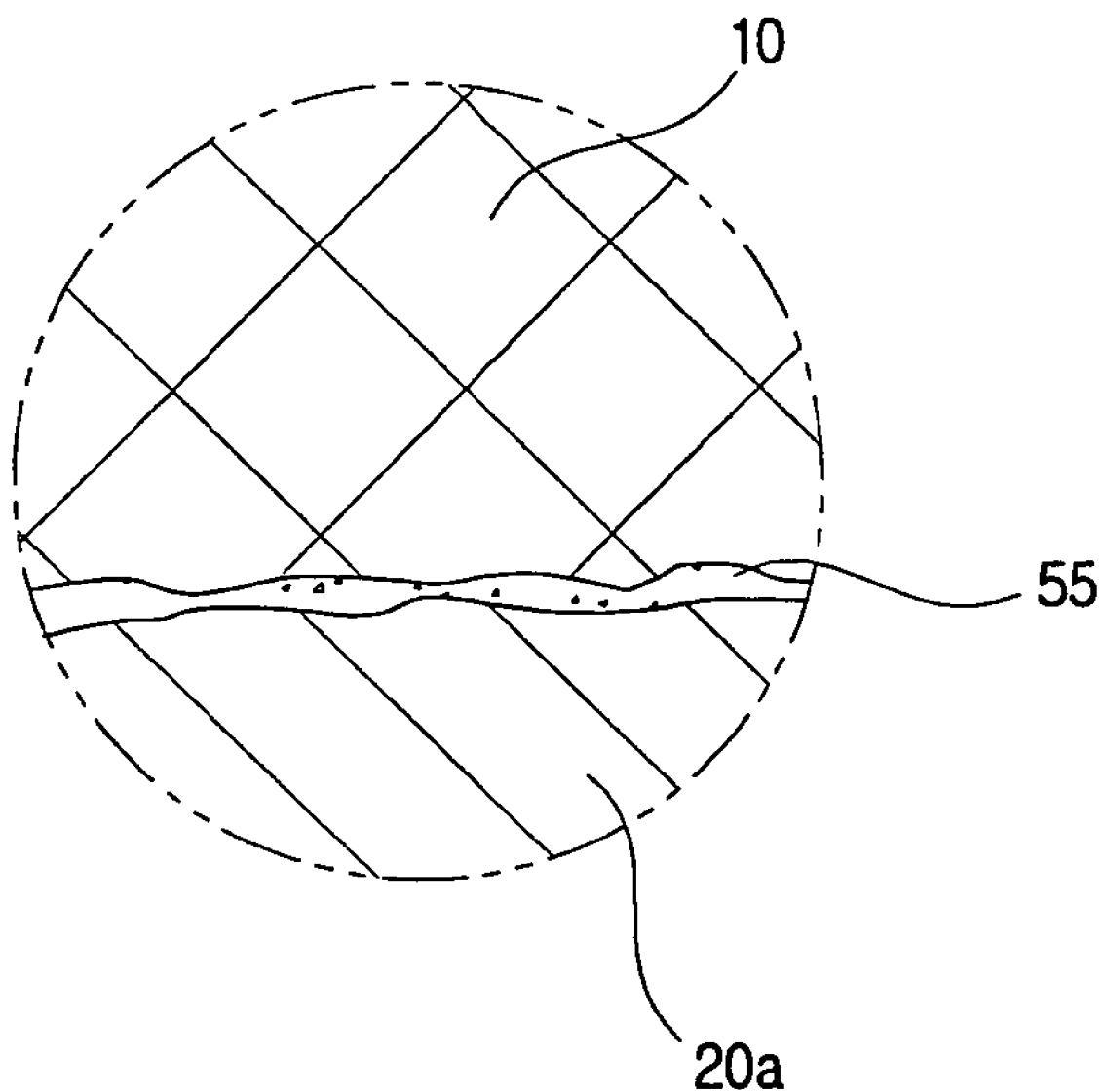
FIG. 6 is an enlarged view of the dielectric material layer and the guide ring of FIGS. 4 and 5.

FIG. 6 is an enlarged view of sides of a dielectric material layer and a guide ring that are in contact. As shown therein, the media gas 55 penetrates a space formed between the dielectric material layer 20a and the guide ring 10. By penetrating the space between the dielectric material layer 20a and the guide ring 10, the media gas 55 is charged and then transfers the heat of the guide ring 10 to the ESC main body 30. Having been charged, the media gas 55 reduces leakage, and increases efficiency of heat transfer from the guide ring 10 to the ESC main body 30.

In a conventional cooling method, only the object is cooled, thereby causing a temperature difference between the guide ring 10 and the object 1. The temperature difference causes the center and the edge of the object 1 to be processed unevenly during the semiconductor manufacturing process.

In the present invention, the guide ring 10 and the ESC main body 30 are combined using the electric charge generated therebetween. Charging the media gas 55 between the ESC main body 30 and the guide ring 10, the temperature difference between the object 1 and the guide ring 10 can be decreased by increasing the efficiency of heat transferred from the guide ring 10 to the ESC main body 30, and thereby allowing uniform processing of the center and the edge of the object 1.

With the above configuration, the present invention can solve non-uniformity in the center and the edge of objects caused by a temperature difference between the object and a guide ring.

By processing the object uniformly, the yield of the object can be increased, thereby lowering manufacturing costs and reducing defectives.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An electrostatic chuck to chuck an object using electrostatic force, the electrostatic chuck comprising:
   a main body to support the object;
   a guide ring supported by the main body and encircling the object;
   a dielectric material layer interposed between the object and the main body;
   a media gas supplier to supply a media gas to the guide ring;
   a power supplier to supply power to the main body;
   a first guide ring dielectric material layer;
   a guide ring electrode; and
   a second guide ring dielectric material layer, wherein;
   the guide ring electrode is interposed between the first ring dielectric material layer and the second guide ring dielectric material layer,
   the first guide ring dielectric material layer is interposed between the guide ring electrode and the guide ring, and
   the second guide ring dielectric material layer is interposed between the guide ring electrode and the main body.

2. The electrostatic chuck according to claim 1, wherein the main body is made with conductive materials such that the power supplied to the main body is transmitted to the dielectric material layer and the guide ring.

3. The electrostatic chuck according to claim 1, further comprising an electrode interposed between the dielectric material layer and the main body, wherein the power supplier supplies power to the electrode.

4. The electrostatic chuck according to claim 3, further comprising a second dielectric material layer interposed between the electrode and the main body.

5. The electrostatic chuck according to claim 1, further comprising a media gas supply hole for the guide ring provided in the main body, wherein the media gas supplied from the media gas supplier flows therethrough and contacts the guide ring.

6. The electrostatic chuck according to claim 1, wherein the object is a planar object.

7. The electrostatic chuck according to claim 1, wherein the object is a plate type wafer.

8. The electrostatic chuck according to claim 1, further comprising a plurality of media gas supply holes provided in the main body, wherein the media gas flows therethrough.

9. The electrostatic chuck according to claim 8, wherein the plurality of media gas supply holes penetrate the main body, the first guide ring dielectric material layer, the guide ring electrode, the second guide ring dielectric material layer, and the dielectric material layer, and wherein the media gas flowing through the media gas supply holes contacts the guide ring and the object.

10. The electrostatic chuck according to claim 9, wherein the media gas contacting the guide ring cools the guide ring and the media gas contacting the object cools the object, whereby the guide ring and the object are maintained at a similar temperature such that an outside edge and a middle part of the object are maintained at a similar temperature.

11. The electrostatic chuck according to claim 8, wherein the plurality of media gas supply holes comprise a first group of media gas supply holes and a second group of media gas supply holes not connected to the first group of media gas supply holes, wherein the first group of media gas supply holes contains a first media gas that contacts the guide ring, and the second group of media gas supply holes contains a second media gas that contacts the object, wherein the first media gas and the second media gas are different.

12. The electrostatic chuck according to claim 1, wherein the main body further comprises:

a coolant supplier to supply coolant; and a plurality of coolant passages provided in the main body, wherein the coolant supplied by the coolant supplier flows through the plurality of coolant passages, thereby cooling the main body.

13. The electrostatic chuck according to claim 1, further comprising an RF generator, to supply RF power to the main body.

14. The electrostatic chuck according to claim 13, wherein the RF power supplied to the main body is transmitted to a reaction gas for a semiconductor manufacturing process.

15. The electrostatic chuck according to claim 1, wherein the dielectric material layer is interposed by layering on the main body.

16. The electrostatic chuck according to claim 1, wherein the dielectric material layer is interposed by bonding on the main body.

17. The electrostatic chuck according to claim 1, wherein the dielectric material layer is made with a highly dielectric material.

18. The electrostatic chuck according to claim 1, wherein the dielectric material layer is made with oxide, nitride, or ceramic.

19. The electrostatic chuck according to claim 1, wherein the dielectric material layer is made of a surface-processed material.

20. The electrostatic chuck according to claim 1, wherein the media gas is helium.

21. The electrostatic chuck according to claim 1, wherein the media gas is argon.

* * * * *

UNITED STATES PATENT AND TRADEMARK OFFICE
CERTIFICATE OF CORRECTION

PATENT NO. : 7,102,872 B2 Page 1 of 1
APPLICATION NO. : 10/823550
DATED : September 5, 2006
INVENTOR(S) : Jae-Yong Cho et al.

It is certified that error appears in the above-identified patent and that said Letters Patent is hereby corrected as shown below:

Column 6, Line 47, change "wherein;" to --wherein:--.

Column 6, Line 48, after "first" insert --guide--.

Signed and Sealed this

Thirtieth Day of January, 2007

JON W. DUDAS
*Director of the United States Patent and Trademark Office*